United States Patent
Couteau et al.

(10) Patent No.: US 6,352,867 B1
(45) Date of Patent: *Mar. 5, 2002

(54) METHOD OF CONTROLLING FEATURE DIMENSIONS BASED UPON ETCH CHEMISTRY CONCENTRATIONS

(75) Inventors: Terri A. Couteau, Rosanky; William Jarrett Campbell; Anthony J. Toprac, both of Austin, all of TX (US)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/478,181

(22) Filed: Jan. 5, 2000

(51) Int. Cl.$^7$ ................................. H01L 21/00
(52) U.S. Cl. ................ 438/8; 438/7; 438/17; 438/18
(58) Field of Search ................ 438/5, 6, 7, 8, 438/9, 10, 11, 12, 13, 14, 15, 16, 17, 18

(56) References Cited

U.S. PATENT DOCUMENTS 4,957,590 A * 9/1990 Douglas ................ 156/643

OTHER PUBLICATIONS

Wolf S., Tauber R. "Silicon Processing for the VLSI Era, vol. 1:Process Technology", Lattice Press, California, 1986, pp. 514–537.*

* cited by examiner

*Primary Examiner*—Matthew Smith
*Assistant Examiner*—Renzo N. Rocchegiani
(74) *Attorney, Agent, or Firm*—Williams, Morgan & Amerson, P.C.

(57) ABSTRACT

The present invention is directed to a method of controlling the width of a gate electrode based upon the etch rate of a chemical bath. In one illustrative embodiment, the method comprises determining an etching rate for a chemical bath, determining the manufactured width of the gate electrode, and varying the time duration of an etching process performed in the bath depending upon the etch rate of the bath and the width of the gate electrode.

34 Claims, 6 Drawing Sheets

METHOD OF CONTROLLING FEATURE DIMENSIONS BASED UPON ETCH CHEMISTRY CONCENTRATIONS

BACKGROUND OF THE INVENTION

1. Field of the Invention

The present invention is directed to the field of semiconductor processing, and, more particularly, to a method of controlling feature dimensions during etching processes.

2. Description of the Related Art

There is a constant drive to reduce the size, or scale, of transistors to increase the overall speed of the transistor, as well as integrated circuit devices incorporating such transistors. A conventional integrated circuit device, such as a microprocessor, is typically comprised of many thousands of transistors formed above the surface of a semiconducting substrate.

By way of background, an illustrative NMOS transistor 10 that may be included in such an integrated circuit device is shown in FIG. 1. The transistor 10 is generally comprised of a gate dielectric 14, a gate conductor 16, and a plurality of source/drain regions 18 formed in a semiconducting substrate 12. The gate dielectric 14 may be formed from a variety of dielectric materials, such as silicon dioxide. The gate conductor 16 may also be formed from a variety of materials, such as polysilicon. The source and drain regions 18 may be formed by one or more ion implantation processes in which a dopant material is implanted into the substrate 12.

Next, a first dielectric layer 26 is formed above the transistor 10, and a plurality of vias or openings 24 are formed in the first dielectric layer 26. Thereafter, the vias 24 are filled with a conductive material, such as a metal, to form contacts 22. In the illustrative transistor 10 shown in FIG. 1, the contacts 22 are electrically coupled to the source and drain regions 18 of the transistor 10. Thereafter, a second dielectric layer 32 may be formed above the first dielectric layer 26. Multiple openings 30 may be formed in the second dielectric layer 32, and the openings 30 may thereafter be filled with a conductive material to form conductive lines 28. Although only a single level of contacts and a single level of conductive lines are depicted in FIG. 1, there may be multiple levels of contacts and lines interleaved with one another. This interconnected network of contacts and lines allows electrical signals to propagate throughout the integrated circuit device. The techniques used for forming the various components depicted in FIG. 1 are known to those skilled in the art and will not be repeated here in any detail.

As feature sizes have decreased, the maintenance and control of the dimensions of the various components or features of a transistor, e.g, the channel length "L" which roughly corresponds to the width "W" of the gate electrode 16, has become very important. For example, small changes in the channel length of a transistor may negatively impact transistor performance. All other things being equal, the greater the channel length, the slower the transistor will operate, and vice versa. Therefore, great care is taken during manufacturing operations to define the various features of a transistor, e.g., gate width, very precisely.

However, processing operations performed after such features have been defined may negatively impact the ability to maintain or control these precisely formed features. After various features of a transistor are formed, the partially formed transistor may be subjected to one or more wet etching processes in a chemical bath during which an entire wafer, or lot of wafers, is submerged in a bath comprised of many chemical components for a set period of time. These etching processes may be performed for a variety of reasons. For example, a partially formed transistor may be subjected to a wet etching process to generally clean the surface of the wafer or to remove layers of material that are no longer desired, e.g., antireflective coatings.

In some situations, the partially formed transistor with the features defined on the transistor is subjected to subsequent etching processes that may also attack the materials out of which the features are defined. Moreover, the etching rate of these chemical baths is dependent upon, among other things, the concentration of the various chemicals of the bath. Such concentrations may vary over time for a variety of reasons. For example, these types of chemical baths may be replenished on a periodic or intermittent basis which inherently leads to variations in the concentration of the various chemical components. Additionally, some chemicals used in such baths tend to evaporate relatively quickly, or break down into water plus some other residual components. These variations in etch chemistry, regardless of their source, create variations in the etching rate of the chemical bath.

The variation in etching rates of the bath can be problematic in a number of respects. For example, in the case where a feature size, e.g., a gate width, is actually manufactured to the lowest end of a tolerance range, performing an etching process using a bath having an etch chemistry that produces the fastest allowable etch rate for a standard duration may further reduce the feature size beyond acceptable limits. Additionally, maintaining control of defined feature sizes is difficult since the etch rate of such subsequent chemical baths may be varied.

The present invention is directed to a method of manufacturing semiconductor device that minimizes or reduces some or all of the aforementioned problems.

SUMMARY OF THE INVENTION

The present invention is directed to a method of manufacturing semiconductor devices. In one illustrative embodiment, the method comprises determining an etch rate for a chemical bath in which the device will be placed, and determining a manufactured size of a feature formed above a semiconducting substrate. The method further comprises determining a duration of an etch process to be performed in the bath and to which the feature will be exposed based upon the etch rate of the bath and the manufactured size of the feature. Thereafter, the etch process is performed in the bath for the determined duration.

In another illustrative embodiment, the method comprises determining an etch rate for a chemical bath, and determining the size of a gate electrode or a variation in the size of a gate electrode as compared to its design size. The method further comprises determining a duration of an etch process to be performed in the bath and to which the gate electrode will be exposed based upon the determined etch rate and the size, or variation in size, of the gate electrode. Thereafter, the etch process is performed in the bath for the determined duration.

BRIEF DESCRIPTION OF THE DRAWINGS

The invention may be understood by reference to the following description taken in conjunction with the accompanying drawings, in which like reference numerals identify like elements, and in which.

Figure 1:
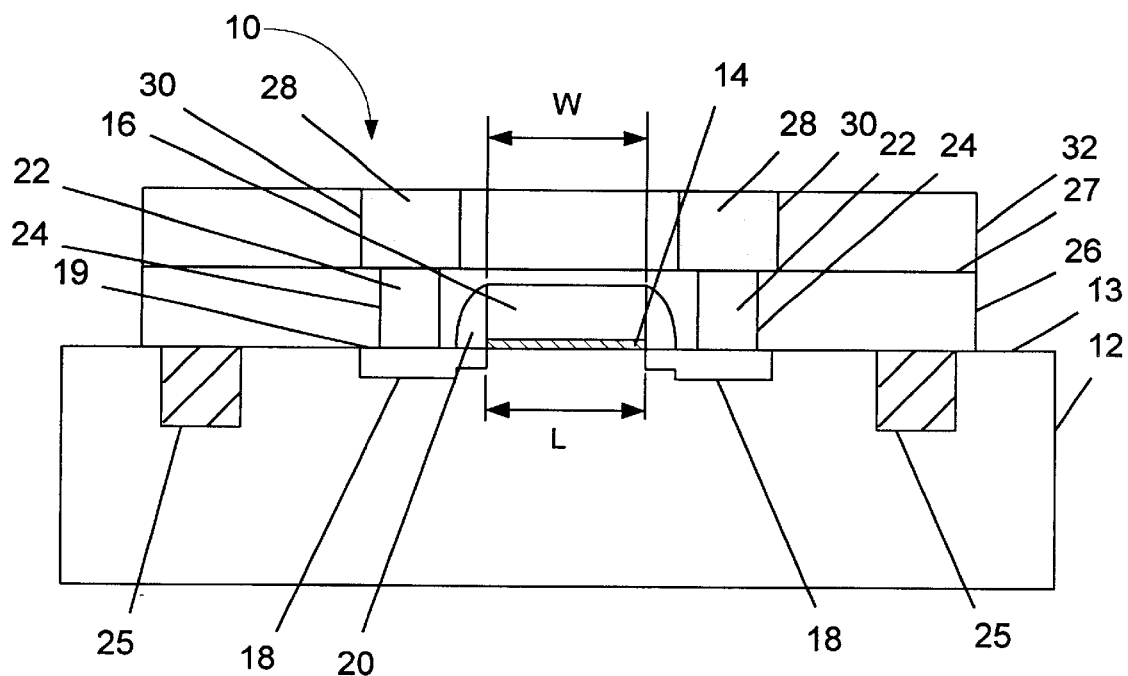
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of monitoring and controlling feature dimensions by controlling the duration of etching processes based upon etch chemistry concentrations and etching rates. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

The present invention may be used with respect to any feature or component of a semiconductor device, e.g., a transistor, that, after it is formed, is subjected to subsequent wet etching processes that may also attack the material comprising the feature. For example, the present invention may be employed to maintain or control the width of a gate electrode (as indicated by the dimension "W" in FIG. 1) comprised of polysilicon of an illustrative transistor device.

Figure 2:
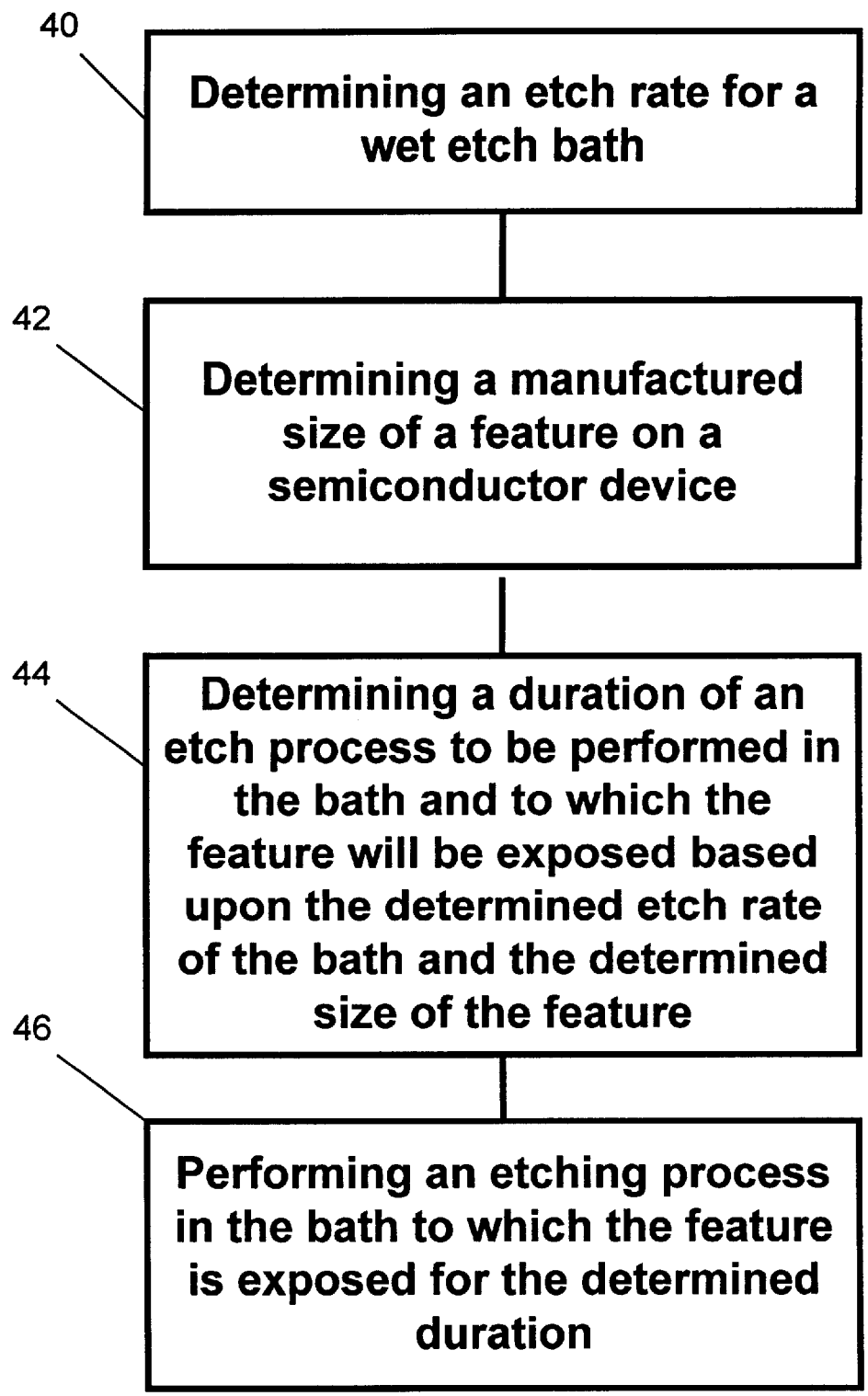
FIGS. 2–5 are flowcharts depicting various illustrative embodiments of the present invention.

In one illustrative embodiment, as indicated in FIG. 2, the method comprises determining an etch rate for a wet etch bath, as indicated at block 40, and determining a manufactured size of a feature on a semiconductor device, as indicated at block 42. The illustrative method further comprises determining a duration of an etch process to be performed in the bath and to which the feature will be exposed based upon the determined etch rate of the bath and the determined manufactured size of the feature, as indicated at block 44, and performing an etching process for the determined duration in the bath, as indicated at block 46.

The process of determining an etch rate for the etch bath, as indicated at block 40, may be determined by a variety of techniques and using various types of equipment. In one illustrative example, the concentration of at least one of the chemicals comprising the bath may be determined by using a concentration monitor, such as a concentration monitor sold under the trademark Horiba that uses IR technology. Of course, a monitoring system that uses titration technology may also be used if desired. Thereafter, the etch rate of the bath may be determined by calculation, or by correlating a given concentration level of one or more of the components of a bath to an etch rate, etc. Of course, the concentration of more than one component of the bath may be determined at block 40, although that is not required.

With respect to the step performed at block 42, the present invention may be used with any feature of a semiconductor device. For ease of reference, in several places through-out the specification, reference will be made to use of the invention in the context of forming and subsequent etching of a gate electrode of a transistor. However, unless specifically recited in the attached claims, the present invention should not be considered to be limited to any particular feature of a semiconductor device.

In one illustrative embodiment where the present invention may be employed, the feature or component of a transistor that is of interest is the width "W," of the gate electrode 16 of a field effect transistor 10. See FIG. 1. As is known to those skilled in the art, such an electrode may be formed by depositing a layer of the appropriate material, e.g., polysilicon, and thereafter defining the component using one or more traditional photolithography and etching processes. After the feature is defined, i.e., after the gate electrode is defined, an appropriate metrology tool is used to determine the feature size of interest, i.e., the gate width. For example, an in-line scanning electron microscope (SEM) or other optical techniques may be employed to determine the width of the gate electrode after it is formed. The size of the feature referenced at block 42 may be an actual measured size of such a feature, or it may be a size determined by some type of analysis of a number of measurements of the feature. For example, the size referenced in block 42 may be an average size calculated from a number of actual measurements of gate electrodes across the surface of a wafer.

Next, as indicated at block 44, the present invention involves determining a duration of an etch process to be performed in the bath and to which the feature will be exposed based upon the determined etch rate for the bath and the determined manufactured size of the feature of the semiconductor device. The size of the feature is measured prior to performing a wet etching process so that the amount of the feature to be removed during the etching process may be determined. The time duration may be determined by an algorithm that is based upon the determined etch rate of the bath and the manufactured size of the feature under consideration. Alternatively, a table could be developed that correlates the etch rate of the bath and the feature size to the time duration of the etch process to be performed in the bath. Of course, in certain situations, it may be the case that very little, if any, of the feature size can be removed. In such a situation, the time duration of the etch process may be very short.

In one illustrative embodiment, a wet etch bath comprised of water, ammonium hydroxide, and peroxide is used to generally clean the surface of a wafer after various processing operations have been performed, including the formation of the gate electrodes comprised of polysilicon above the substrate. Such a chemical bath tends to attack the polysilicon gate electrode, and it is inherently unstable due to the tendency of ammonium to evaporate and the tendency of the peroxide to break down into water. Moreover, these components both need to be replenished on a periodic basis, e.g., every two hours or so depending upon the volume of wafers etched in the bath. All of these factors tend to cause variations in the concentrations of the various components of the bath. In turn, the variations in the concentrations of the various chemicals in the bath affect the etch rate of the bath and the amount of the polysilicon gate electrode consumed during such a process. Of course, the present invention is not limited to any particular etch chemistry. For example, the present invention may also be employed where a bath is comprised of phosphoric acid and water to strip off a mask or layer comprised of silicon nitride, or to remove antireflective coating materials commonly used in photolithography processes.

Figure 3:
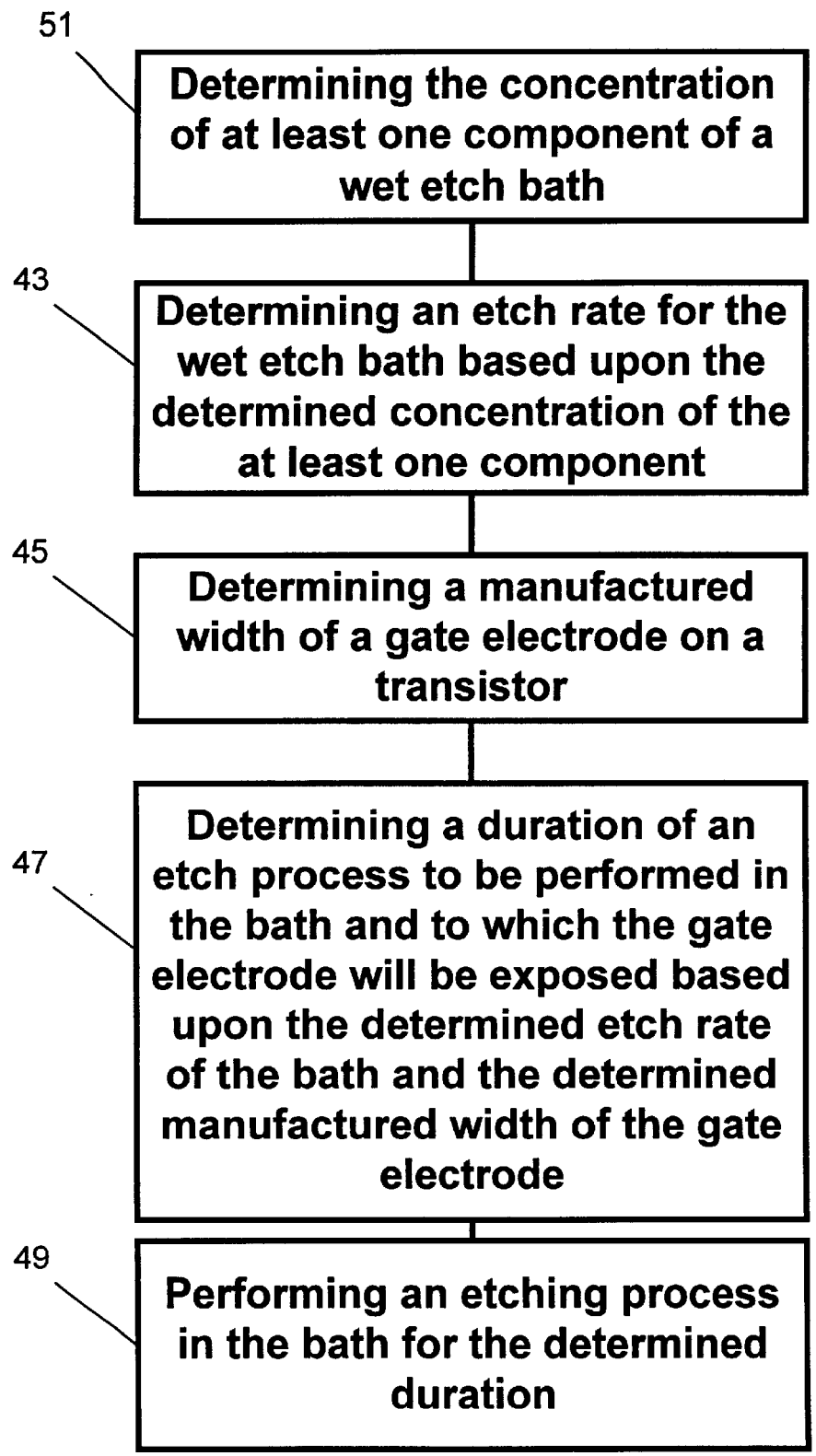

Yet another illustrative embodiment of the present invention is depicted in FIG. 3. As shown therein, the method comprises determining the concentration of at least one component of a wet etch bath, as indicated at block 41, determining an etch rate for the wet etch bath based upon the determined concentration of the component of the bath, as referenced at block 43, and determining a manufactured width of a gate electrode on a transistor, as stated at block 45. The illustrative method for comprises determining a duration of an etch process to be performed in the bath and to which the gate electrode will be exposed based upon the determined etch rate of the bath and the determined manufactured width of the gate electrode, as indicated at block 47. The method further comprises performing an etching process in the bath for the determined duration, as referenced at block 49.

As with the other illustrative embodiments of the present invention, the concentration of the components of the bath may be determined by a variety of techniques, e.g., through use of a concentration monitor. The etch rate determined based upon these concentration measurements may be determined by calculation or by correlating various concentrations of various chemicals to appropriate etching rates. The gate electrode referenced at block 45 may be comprised of any material suitable for such purpose, e.g., polysilicon, and it may be manufactured using a variety of known techniques. The width of the gate electrode after it is manufactured may be determined by any metrology tool capable of performing such measurements, e.g., an in-line SEM, and this width may be an actual measured width or it may be a width determined by some form of statistical analysis, e.g., averaging. The duration of the etch rate determined at block 47 may be done by calculation or by reference to a table that correlates the determined etch rate of the bath and the determined manufactured width of the gate electrode to an appropriate residence time in the bath.

In addition to insuring that a feature size, e.g., a width of a gate electrode, is maintained within acceptable limits in subsequent wet etching processes, the present invention may also be used to compensate for errors in manufacturing of a semiconductor device. That is, if the gate electrode of a semiconductor device is made wider than it is supposed to be, i.e., wider than the design width of the gate electrode, the residence time in a subsequent wet etching process may be increased, depending upon the etch rate of the bath, as determined from the concentration levels of the components of the bath, to remove more of the gate electrode than would otherwise be removed. In effect, the wet etching process is used to reduce the width of the overwide gate electrode such that it is back within acceptable limits for the particular application. Conversely, if the gate width, as manufactured, is smaller than its anticipated size, the time duration may be decreased so as to remove less of the gate electrode during subsequent processing.

Figure 4:
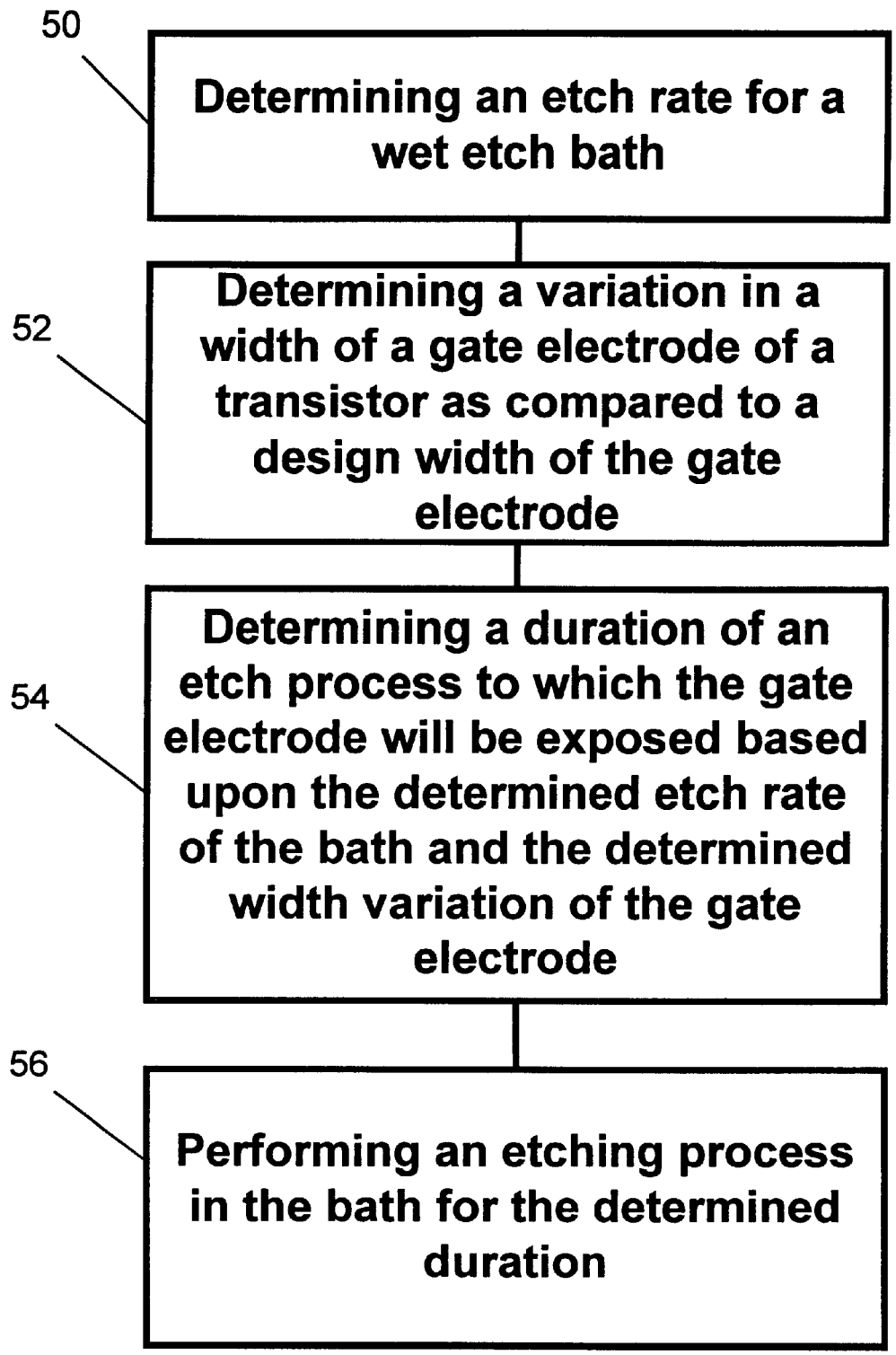

One such illustrative embodiment of the present invention is depicted in flowchart form in FIG. 4. As shown therein, the method comprises determining an etch rate for a wet etch bath, as indicated at block 50; and determining a variation in a width of a gate electrode of a transistor as compared to a design width of the gate electrode, as indicated at block 52. The method further comprises determining a duration of a wet etch process to which said gate electrode will be exposed based upon the determined width variation of the gate electrode and the determined etch rate of the bath, as referenced at block 54. Lastly, the method comprises performing the etch process for the determined time, as indicated at block 56. The variation in the width of a transistor may be determined by measuring the width of the gate electrode, as manufactured, using an appropriate tool, such as an in-line scanning electron microscope (SEM) or other optical techniques. This variation may be based upon an average that is determined based upon the measurements of multiple gate electrodes formed across the surface of the wafer.

Figure 5:
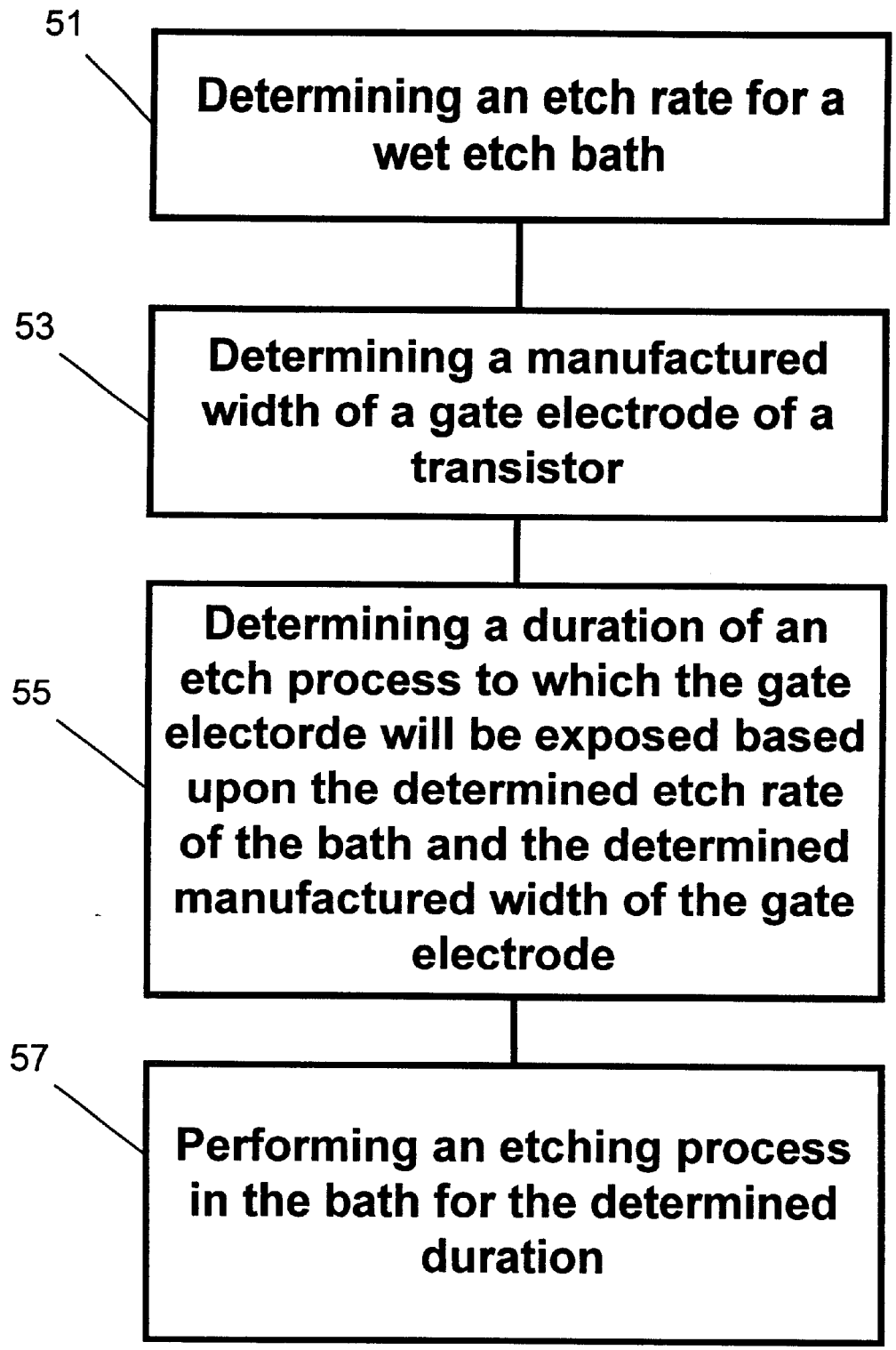

Yet another illustrative embodiment of the invention is depicted in FIG. 5. As shown therein, the method comprises determining an etch rate for a wet etch bath, as indicated at block 51, and determining a manufactured width of a gate electrode of a transistor, as indicated at block 53. The method further comprises determining a duration of an etching process to which said gate electrode will be exposed based upon the determined manufactured width of the gate electrode and the determined etch rate of the bath, as referenced at block 55, and performing an etching process on said gate electrode in said bath for said determined duration. In the embodiment of the invention depicted in FIG. 5, the absolute size of the gate conductor may be measured and, in addition to the etch rate of the bath, used as a basis to determine the duration of the wet etching process to which the gate electrode will be exposed.

The present invention may also be embodied in a machine or computer readable format, e.g., an appropriately programmed computer, a software program written in any of a variety of programming languages, etc. The software program would be written to carry out various functional operations of the present invention, such as those indicated in FIGS. 2–5, and elsewhere in the specification. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g., a processor.

Figure 6:
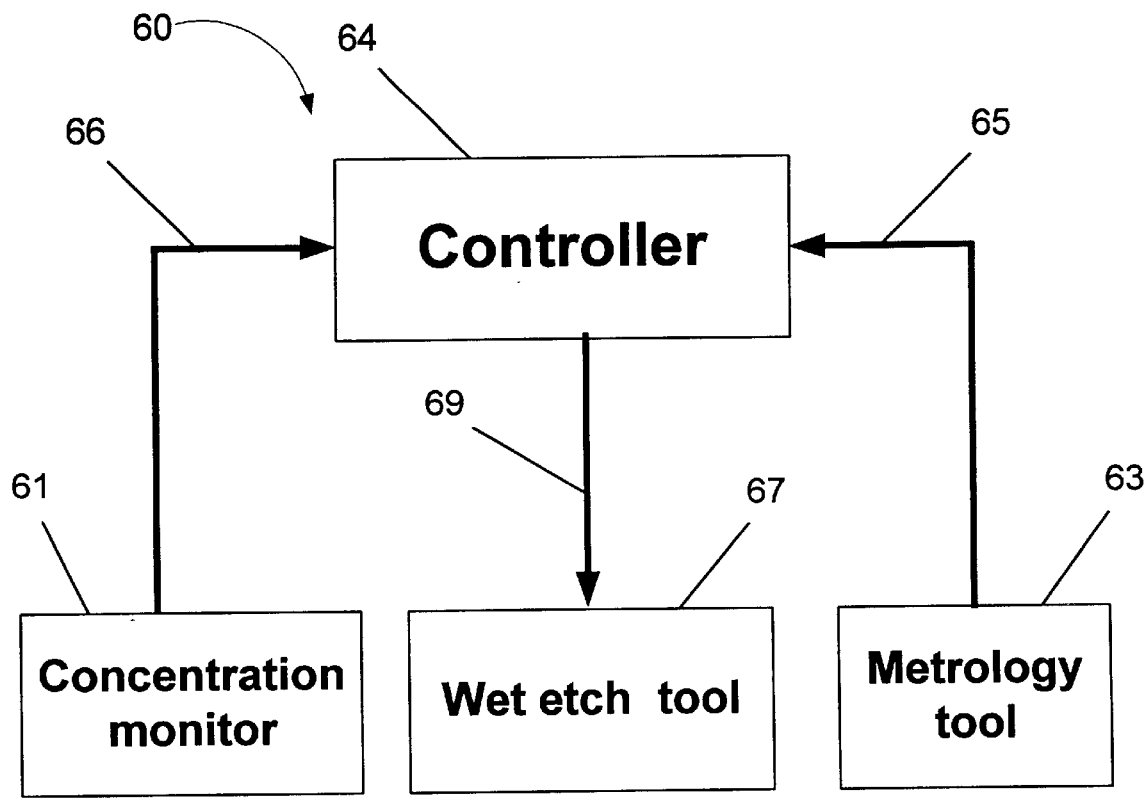
FIG. 6 is an illustrative system in which the present invention may be employed.

The present invention is also directed to a processing system, e.g., a processing tool or combination of processing tools, for accomplishing the present invention. As shown in FIG. 6, an illustrative system 60 is comprised of a concentration monitor 61, a wet etch tool 67, a metrology tool 63, and a controller 64. In one illustrative process flow, the metrology tool 63 is used to determine the manufactured width of a gate electrode. This information is input into the controller 64 via input line 65. The concentration monitor 61 monitors the concentration of the various components of interest in the chemical bath in the wet etch tool 67. This monitoring may be done on a continuous or periodic basis, e.g., the monitoring may be performed before each lot of wafers is run through the wet etch tool 67 or it may be performed after a set number of lots of wafers has been processed through the wet etch tool 67. The concentrations determined by the concentration monitor 61 are input to the controller 64 via input line 66. The controller 64 then determines a residence time in the chemical bath in the wet etch tool 67, and communicates this residence time to the wet etch tool 67 via output line 69. Thereafter, the wafers are subjected to an etching process in the etch tool for the duration determined by the controller 64.

The time duration determined by the controller 64 may be based upon calculations made in the controller, or based upon a database containing information correlating desired etching time to the etch rate of the bath and/or the width, or variations in the width, of the gate electrode. The controller 64 may be any type of device that includes logic circuitry for executing instructions. The controller 64 depicted in FIG. 6 may be a stand-alone controller or it may be one or more of the controllers already resident on either the concentration monitor 61, the wet etch tool 67, or the metrology tool 63. Moreover, the various functions described herein to be performed by the controller 64 may be performed by or shared among multiple controllers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   measuring a manufactured size of a feature above a semiconducting substrate;
   calculating an etch rate for a wet etch bath;
   determining a duration of an etch process to be performed in said bath after said feature is formed and to which said feature will be exposed, said determination being based upon said calculated etch rate and said measured manufactured size of said feature; and
   performing the etch process in said bath for said determined duration.

2. The method of claim 1, wherein measuring a manufactured size of a feature above a semiconducting substrate comprises measuring a manufactured width of a gate electrode of a transistor.

3. The method of claim 1, wherein measuring a manufactured size of a feature above a semiconducting substrate comprises making a plurality of measurements of multiple gate electrodes on a semiconductor device.

4. The method of claim 1, wherein determining a duration of an etch process to be performed in said bath after said feature is formed and to which said feature will be exposed, said determination being based upon said calculated etch rate and said measured manufactured size of said feature, comprises calculating a duration of an etch process to be performed in said bath after said feature is formed and to which said feature will be exposed, said determination being based upon said calculated etch rate and said measured manufactured size of said feature.

5. The method of claim 1, wherein calculating an etch rate for a wet etch bath comprises calculating an etch rate for a wet etch bath comprised of water, ammonium hydroxide and peroxide.

6. The method of claim 5, wherein measuring a manufactured size of a feature formed above a semiconductor substrate comprises measuring a manufactured width of a gate electrode comprised of polysilicon.

7. The method of claim 6, wherein determining a duration of an etch process to be performed in said bath after said feature is formed and to which said feature will be exposed, said determination being based upon said calculated etch rate and said measured manufactured size of said feature, comprises determining a duration of an etch process to be performed on said gate electrode comprised of polysilicon after said gate electrode is formed based upon the measured manufactured width of said gate electrode and upon a concentration of at least one of said water, ammonium hydroxide and peroxide.

8. The method of claim 1, wherein calculating an etch rate for a wet etch bath comprises calculating an etch rate for a wet etch bath based upon an analysis of the chemistry of said bath.

9. A method, comprising:
   measuring a manufactured size of a feature above a semiconducting substrate;
   calculating an etch rate for a wet etch bath;
   providing said measured manufactured size of said feature and said calculated etch rate to a controller that determines a duration of an etch process to be performed in said bath after said feature is formed and to which said feature will be exposed based upon said calculated etch rate and said measured manufactured size of said feature; and performing the etch process in said bath for said determined duration.

10. The method of claim 9, wherein measuring a manufactured size of a feature above a semiconducting substrate comprises measuring a manufactured width of a gate electrode of a transistor.

11. The method of claim 9, wherein measuring a manufactured size of a feature above a semiconducting substrate comprises making a plurality of measurements of multiple gate electrodes on a semiconductor device.

12. The method of claim 9, wherein determining a duration of an etch process to be performed in said bath after said feature is formed and to which said feature will be exposed, said determination being based upon said calculated etch rate and said measured manufactured size of said feature, comprises calculating a duration of an etch process to be performed in said bath after said feature is formed and to which said feature will be exposed, said determination being based upon said calculated etch rate and said measured manufactured size of said feature.

13. The method of claim 9, wherein calculating an etch rate for a wet etch bath comprises calculating an etch rate for a wet etch bath comprised of water, ammonium hydroxide and peroxide.

14. The method of claim 13, wherein measuring a manufactured size of a feature formed above a semiconductor substrate comprises measuring a manufactured width of a gate electrode comprised of polysilicon.

15. The method of claim 14, wherein determining a duration of an etch process to be performed in said bath after said feature is formed and to which said feature will be exposed, said determination being based upon said calculated etch rate and said measured manufactured size of said feature, comprises determining a duration of an etch process to be performed on said gate electrode comprised of polysilicon after said gate electrode is formed based upon the measured manufactured width of said gate electrode and upon a concentration of at least one of said water, ammonium hydroxide and peroxide.

16. The method of claim 9, wherein calculating an etch rate for a wet etch bath comprises calculating an etch rate for a wet etch bath based upon an analysis of the chemistry of said bath.

17. A method, comprising:
measuring a manufactured width of a gate electrode formed above a semiconducting substrate;
calculating an etch rate for a wet etch bath;
providing said measured manufactured width of said gate electrode and said calculated etch rate to a controller that determines a duration of an etch process to be performed in said bath after said feature is formed and to which said gate electrode will be exposed based upon said calculated etch rate and said measured manufactured width of said gate electrode; and
performing the etch process in said bath for said determined duration.

18. The method of claim 17, wherein measuring a manufactured width of a gate electrode formed above a semiconducting substrate comprises making a plurality of measurements of multiple gate electrodes on a semiconductor device.

19. The method of claim 17, wherein said controller determines a duration of an etch process to be performed in said bath by calculating a duration of an etch process to be performed in said bath after said gate electrode is formed and to which said gate electrode will be exposed based upon said calculated etch rate and said measured manufactured width of said gate electrode.

20. The method of claim 17, wherein calculating an etch rate for a wet etch bath comprises calculating an etch rate for a wet etch bath comprised of water, ammonium hydroxide and peroxide.

21. The method of claim 20, wherein measuring a manufactured width of a gate electrode formed above a semiconductor substrate comprises measuring a manufactured width of a gate electrode comprised of polysilicon.

22. The method of claim 21, wherein determining a duration of an etch process to be performed in said bath after said feature is formed and to which said feature will be exposed, said determination being based upon said calculated etch rate and said measured manufactured size of said feature, comprises determining a duration of an etch process to be performed on said gate electrode comprised of polysilicon after said gate electrode is formed based upon the measured manufactured width of said gate electrode and upon a concentration of at least one of said water, ammonium hydroxide and peroxide.

23. The method of claim 17, wherein calculating an etch rate for a wet etch bath comprises calculating an etch rate for a wet etch bath based upon an analysis of the chemistry of said bath.

24. A method, comprising:
measuring a concentration of at least one component of a wet etch bath;
calculating an etch rate for the wet etch bath based upon the measured concentration of said at least one component of said wet etch bath;
measuring a manufactured width of a gate electrode formed above a semiconducting substrate;
providing said calculated etch rate and said measured manufactured width of said gate electrode to a controller that determines a duration of an etch process to be performed in said bath after said gate electrode is formed and to which said gate electrode will be exposed based upon said calculated etch rate of said wet etch bath and said measured manufactured width of said gate electrode; and
performing the etch process in said bath for said determined duration.

25. The method of claim 24, wherein measuring a manufactured width of a gate electrode comprises making a plurality of measurements of multiple gate electrodes formed above a semiconducting substrate.

26. The method of claim 24, wherein measuring a concentration of at least one component of a wet etch bath comprises positioning a concentration monitor in said bath and obtaining concentration readings from said monitor.

27. The method of claim 24, wherein said controller determines a duration of an etch process to be performed in said bath after said gate electrode is formed by calculating a duration of an etch process to be performed in said bath after said gate electrode is formed and to which said gate electrode will be exposed based upon said calculated etch rate of said bath and said measured manufactured width of said gate electrode.

28. The method of claim 24, wherein calculating an etch rate for a wet etch bath comprises calculating an etch rate for a wet etch bath comprised of water, ammonium hydroxide and peroxide.

29. The method of claim 24, wherein calculating an etch rate for a wet etch bath comprises calculating an etch rate for a wet etch bath based upon an analysis of the chemistry of said bath.

30. A method, comprising:
    measuring a concentration of at least one component of a wet etch bath;
    calculating an etch rate for the wet etch bath based upon the measured concentration of said at least one component of said wet etch bath;
    measuring a manufactured width of a gate electrode comprised of polysilicon formed above a semiconducting substrate;
    providing said calculated etch rate and said measured manufactured width of said gate electrode to a controller that calculates a duration of an etch process to be performed in said bath after said gate electrode is formed and to which said gate electrode will be exposed, said calculation being based upon said calculated etch rate of said wet etch bath and said measured manufactured width of said gate electrode; and
    performing the etch process in said bath for said calculated duration.

31. The method of claim 30, wherein measuring a manufactured width of a gate electrode comprises making a plurality of measurements of multiple gate electrodes formed above a semiconducting substrate.

32. The method of claim 30, wherein measuring a concentration of at least one component of a wet etch bath comprises positioning a concentration monitor in said bath and obtaining concentration readings from said monitor.

33. The method of claim 30, wherein calculating an etch rate for a wet etch bath comprises calculating an etch rate for a wet etch bath comprised of water, ammonium hydroxide and peroxide.

34. The method of claim 30, wherein calculating an etch rate for a wet etch bath comprises calculating an etch rate for a wet etch bath based upon an analysis of the chemistry of said bath.

* * * * *